United States Patent
Liu

(10) Patent No.: US 9,022,717 B2
(45) Date of Patent: May 5, 2015

(54) PANEL-STORING SHELF AND PANEL-TRANSPORTING SYSTEM

(75) Inventor: Peng Liu, Beijing (CN)

(73) Assignee: Beijing BOE Optoelectronics Technology Co., Ltd., Beijing (CN)

(*) Notice: Subject to any disclaimer, the term of this patent is extended or adjusted under 35 U.S.C. 154(b) by 931 days.

(21) Appl. No.: 13/153,635

(22) Filed: Jun. 6, 2011

(65) Prior Publication Data

US 2011/0305546 A1    Dec. 15, 2011

(30) Foreign Application Priority Data

Jun. 10, 2010    (CN) .......................... 2010 1 0203432

(51) Int. Cl.
| | |
|---|---|
| *B65G 1/12* | (2006.01) |
| *B65G 1/14* | (2006.01) |
| *B65G 49/06* | (2006.01) |
| *H01L 21/67* | (2006.01) |
| *H01L 21/673* | (2006.01) |
| *H01L 21/677* | (2006.01) |

(52) U.S. Cl.
CPC ................ *B65G 1/14* (2013.01); *B65G 49/067* (2013.01); *B65G 49/068* (2013.01); *H01L 21/67259* (2013.01); *H01L 21/67303* (2013.01); *H01L 21/67706* (2013.01)

(58) Field of Classification Search
CPC .... B65G 49/068; B65G 49/067; B65G 1/127; H01L 21/67303; H01L 21/67769
USPC ........... 414/331.02, 331.04, 331.05; 211/144
See application file for complete search history.

(56) References Cited

U.S. PATENT DOCUMENTS

| | | | | |
|---|---|---|---|---|
| 3,754,632 | A * | 8/1973 | Kreutter ...................... | 198/347.3 |
| 5,018,618 | A * | 5/1991 | Sjogren ....................... | 198/347.3 |
| 6,099,230 | A * | 8/2000 | Hitch ......................... | 414/331.02 |
| 8,366,376 | B2* | 2/2013 | Herrmann ................... | 414/790.8 |
| 2004/0149541 | A1 | 8/2004 | Sauer | |
| 2004/0222177 | A1* | 11/2004 | Shai .............................. | 211/121 |
| 2006/0182556 | A1* | 8/2006 | Liu et al. ................... | 414/331.01 |
| 2008/0308392 | A1* | 12/2008 | Simke et al. ................. | 198/842 |
| 2011/0174700 | A1* | 7/2011 | Weigl ............................ | 209/552 |

FOREIGN PATENT DOCUMENTS

| | | |
|---|---|---|
| CN | 1525933 A | 9/2004 |
| CN | 2790975 Y | 6/2006 |
| JP | 08-020411 A | 1/1996 |
| JP | 08-020414 A | 1/1996 |
| JP | 10-297717 A | 11/1998 |

(Continued)

OTHER PUBLICATIONS

Second Chinese Office Action dated May 30, 2013; Appln. No. 2010102034324.
Third Chinese Office Action dated Nov. 7, 2013; Appln. No. 201010203432.4.

(Continued)

*Primary Examiner* — Kaitlin Joerger
(74) *Attorney, Agent, or Firm* — Ladas & Parry LLP

(57) ABSTRACT

A panel-storing shelf comprises at least two support members, at least two tracks disposed around a surface of each of the at least two support members, respectively, to rotate about respective support member, and at least two brackets disposed on each of the at least two tracks, respectively, and at the same level, to hold the panel and rotate along with the track.

10 Claims, 7 Drawing Sheets

(56) References Cited

FOREIGN PATENT DOCUMENTS

| | | |
|---|---|---|
| JP | 2000-128314 A | 5/2000 |
| JP | 2002-104641 A | 4/2002 |

OTHER PUBLICATIONS

Fourth Chinese Office Action dated Apr. 15, 2014; Appln. No. 201010203432.4.

* cited by examiner

PANEL-STORING SHELF AND PANEL-TRANSPORTING SYSTEM

BACKGROUND

Embodiments of the present invention relate to a panel-storing shelf and a panel-transporting system.

During manufacturing of thin film transistor liquid crystal display (TFT-LCDs), panel-storing shelves are frequently used to transport panels in product lines. Holding layers for holding panels are fixedly disposed in each panel-storing shelf. On each holding layer, one panel can be placed. There are provided wheels at the bottom of the panel-storing shelf, so the panel-storing shelf can be moved in product lines.

During transportation of the panels, it is necessary to move panels from a panel-transporting stage to a panel-storing shelf or to take out panels from a panel-storing shelf and place them on a panel-transporting stage. This accessing operation usually depends on the cooperation of other devices, such as a robot. The robot is used to take out panels in the panel-storing shelf for a next process, or to place processed panels into the panel-storing shelf again. The holding layer in the panel-storing shelf is fixed, so the robot has to move to access panels. The robot completes the action of placing or taking out mainly by 3-dimensional movements, that is, each action of placing or taking out needs 3-dimensional movements, and only after the 3-dimensional movement is completed, the second action of placing or taking out can be performed.

In the above manner, the holding layer in the panel-storing shelf is fixed, and each action of placing or taking out needs a 3-dimensional movement of the robot; therefore, the operation of taking out or placing the panel is complicated, the time for transporting the panel is highly increased, the transportation efficiency of the panel is low, and the productivity of the product line is reduced.

SUMMARY

An embodiment of present invention provides a panel-storing shelf comprising: at least two support members; at least two tracks respectively disposed around a surface of one of the at least two support members and capable of rotating about the respective support member; and at least two brackets respectively disposed on one of the at least two tracks and at the same level to hold a panel, and capable of rotating along with the respective track.

An embodiment of present invention provides a panel-transporting system, comprising a transporting stage; and the above-mentioned panel-storing shelf, wherein the transporting stage is provided used to transport a panel out or into in the panel-storing shelf.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION

In order to make the objective, the technical solution and the advantages of the embodiments of the present invention become more apparent, technical solutions of the embodiments of the present invention will be described hereafter with reference to the accompanying drawings. It should be understood that only some embodiments of the present invention are described herein, not all embodiments of the present invention. All other embodiments obtained by those ordinary skilled in the art without inventive labor based on the embodiments of the present invention will fall into the scope of the present invention.

An embodiment provides a panel-storing shelf and a panel-transporting system comprising the panel-storing shelf. In the panel-storing shelf, a track is disposed on a surface of a support member, and brackets are disposed on the track. The track may be a crawler belt, band or the like and can rotate about the support member so as to drive the brackets to rotate. Besides the panel-storing shelf, the panel-transporting system further comprises a transporting stage. The transporting stage can be disposed adjacent to the panel-storing shelf, and cooperates with the panel-storing shelf, that is, the panels in the panel-storing shelf can be transferred to the transporting stage for taking out, or may be loaded into the panel-storing shelf from the transporting stage for storing or holding. The cooperation between the transporting stage and the panel-storing shelf can replace a robot, so that the robot can be omitted.

Solutions of embodiments of the present invention will be described in details hereafter with reference to the attached drawings and specific embodiment.

First Embodiment

Figure 1:
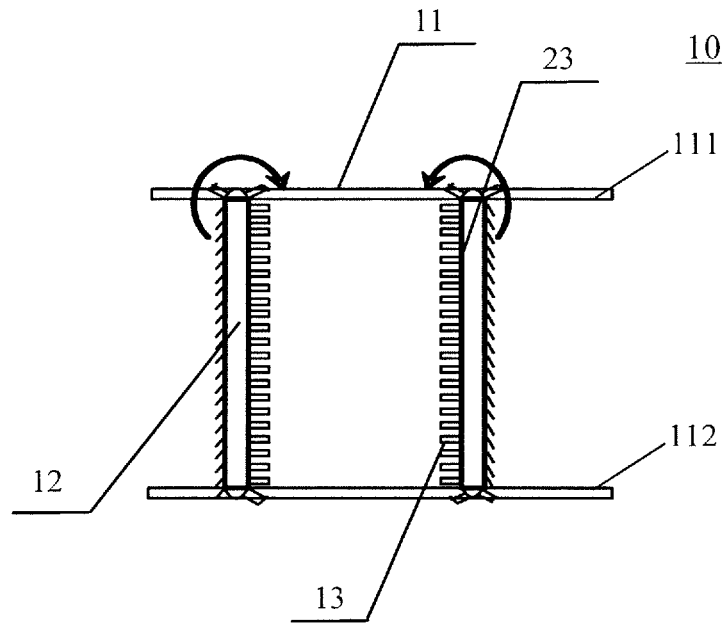
FIG. 1 is a structural view of the panel-storing shelf according to the first embodiment of the present invention.

FIG. 1 is a structural view of the panel-storing shelf 10 according to the first embodiment of the present invention. As shown in FIG. 1, the panel-storing shelf of the embodiment comprises a casing 11, support members 12, tracks 23 and brackets 13.

The casing 11 may have, for example, a cubic profile. There are support members 12 perpendicularly disposed between the top wall 111 and bottom wall 112 of the casing 11. The support members 12 may be, for example, blocking rods. Several adjacent support members 12 can constitute a panel-storing unit, and each of the panel-storing unit may hold a column of panels. The number of the support members 12 may be determined depending on the actual size and weight of each panel; for example, more support members can be provided for bigger and heavier panels. The location of support member 12 and the distance between support members 12 can be adjusted according to the actual size of the panels to be placed. For example, as shown in FIG. 1, two columns of support members 12 in the panel-storing shelf constitute a panel-storing unit. Brackets 13 are used to hold panels thereon. The brackets 13 each hold or support one side of the panel; the brackets 13 one the same level can constitute a holding layer. There are holding layers in the panel-storing unit.

In the panel-storing shelf 10 of the present embodiment, each track 23 is disposed around the surface of each support member 12. The brackets 13 are disposed on the track 23 to hold one side of the panel to be placed thereon. In each panel-storing unit, brackets at the same level constitute a holding layer to hold or support a panel thereon. The track can rotate about the support member 12 at which the track disposed under the control of a controller; for example, the rotating direction of the track may be changed to make the holding layer ascend or descend in the height direction, that is, the movement direction of the tracks disposed on the support members are cooperate with each other, so that holding layer formed with brackets 13 at the same level can ascend or descend. For example, the arrow illustrating rotating direction in FIG. 1 denotes that holding layer formed with brackets 13 can move from top to bottom with the tracks, so that the panel placed on brackets 13 can also move from top to bottom in the panel-storing shelf 10.

Figure 2:
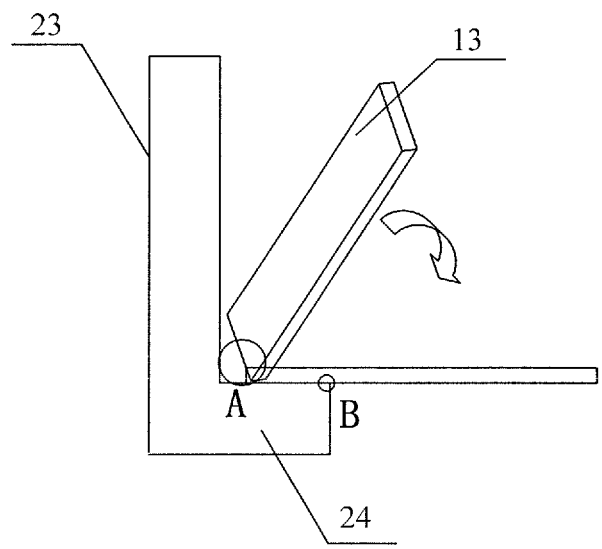
FIG. 2 is a structural view illustrating the installation of the bracket and track in FIG. 1.
Figure 3:
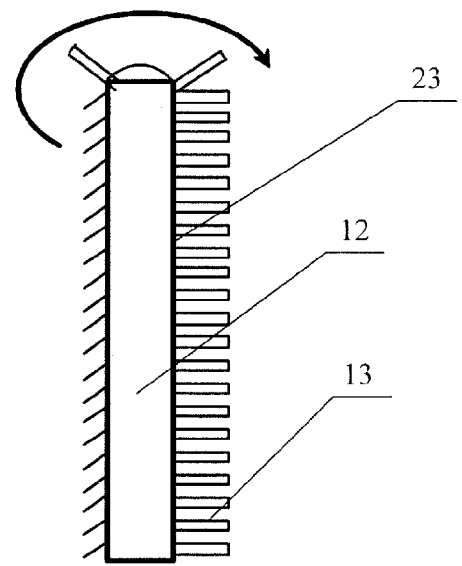
FIG. 3 is a view illustrating the force analysis of the vertical movement of the bracket in FIG. 1.

FIG. 2 is a structural view illustrating the installation of the bracket and track in FIG. 1, and FIG. 3 is a view illustrating the force analysis of the vertical movement of the bracket in FIG. 1. As shown in FIGS. 2 and 3, point A is a pivotable point of the bracket 13 at which the bracket 13 is fixed on the track 23; point B is a support point when the bracket 13 rotates along the direction indicating by the arrow until it is completely opened, limiting an open angle. On the track 23, a holding member 24 may be disposed under each bracket 13 to support the bracket 13 thereon. On the holding member 24, the bracket 13 can rotate to reach the holding member 24, for example, at the horizontal direction. Given that the brackets 13 on the support member 12 at right side of the system shown in FIG. 1 rotates clockwise, when the brackets 13 move to the right side of the support member 12 at the right side, under the effect of their own weight, the brackets 13 rotationally fall down on the respective supporting members 24. Due to the supporting effect of the holding member 24, the brackets 13 will rest on the respective holding members 24 so to be in a parallel state in which panels can be placed thereon. On the other hand, when the brackets 13 rotate to the left side of the support member 12 at the right side, since the holding members 24 are on the upper side of the brackets and cannot support the brackets any more, the brackets 13 hang down naturally, thus reducing the space occupied by the entire device and avoiding unnecessary interfere which occurs when the brackets are supported horizontally.

Moreover, the bracket 13 can be disposed on the track 23 in another structure; for example, the brackets 13 can be fixed on each track 23 directly, and the brackets 13 can be fixed perpendicular to the tangent of the fixed point so that panels can be horizontally supported thereon. Compared with this structure, the structure of the embodiment shown in FIG. 3 can save space.

According to the panel-storing shelf of the embodiment, by providing a track on each support member and disposing the brackets on the track for holding panel, the panel can move vertically in the panel-storing shelf, which provides more flexibility for operations. Since the panel can flexibly move vertically in the panel-storing shelf, compared with the structure that the panel is fixedly supported, it is more convenient to cooperate with other automatic transporting equipments to transport panels, and the speed of movement, such as taking out the panel, can be improved, thus the transporting efficiency of the panel can be improved.

Second Embodiment

Figure 4:
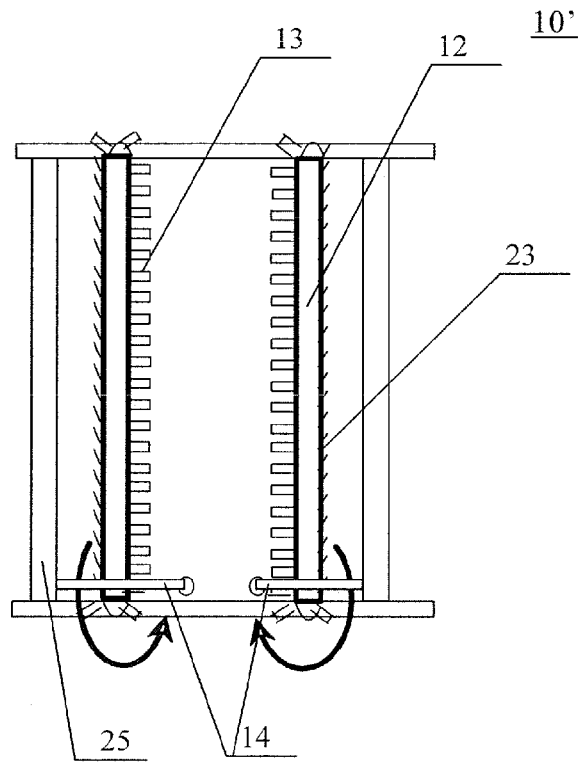
FIG. 4 is the first structural view illustrating the panel-storing shelf according to the second embodiment of the present invention.
Figure 5:
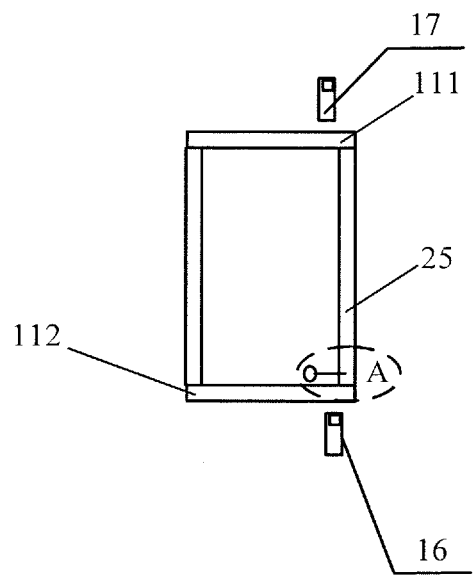
FIG. 5 is the second structural view illustrating the panel-storing shelf according to the second embodiment of the present invention.
Figure 6:
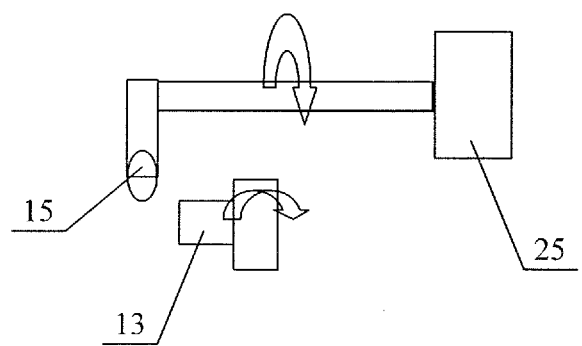
FIG. 6 is an enlarged top view illustrating the portion A in FIG. 5 when an auxiliary rod is in a stretching state.

FIG. 4 is the first structural view illustrating the panel-storing shelf 10' according to the second embodiment of the present invention, FIG. 5 is the second structural view illustrating the panel-storing shelf according to the second embodiment of the present invention, and FIG. 6 is an enlarged top view illustrating the portion A in FIG. 5 when an auxiliary rod is in a stretching state. As shown in FIGS. 4-6, FIG. 4 is the front view of the panel-storing shelf, and FIG. 5 is the side view of the panel-storing shelf.

The panel-storing shelf 10' of this embodiment comprises a casing 11, support members 12 and brackets 13. A track 23 disposes around each support member 12, brackets 13 are disposed on the tracks 23, and brackets 13 at the same level can constitute one holding layer to hold or support a panel thereon. Brackets 13 can rotate along with the track 23 to drive the panel thereon to move up or down. The specific structure can be obtained by referring to the first embodiment for and will not be repeated here.

The panel-storing shelf 10' in this embodiment is modified based on the first embodiment. An auxiliary member is disposed on one fixing device 25 in the panel-storing shelf 10', and the auxiliary member can be used to place on the bracket the panels loading from exterior or to take out the panels held or supported on the brackets. A rotatable wheel can be further provided on the end of the auxiliary member to assist the operation of placing panels into the panel-storing shelf or taking out panels from the panel-storing shelf, and works to temporarily hold a panel. The auxiliary member can be, for example, an auxiliary rod 14. The fixing device 25 can be a supporting rod for supporting the top wall and the bottom wall of the panel-storing shelf or a support surface, as long as it can support the auxiliary member. The fixing device can also be a support member equipped with a track, as long as the location of the fixing device 25 does not interfere with the movement of the track 23. The auxiliary rod 14 can be disposed on the fixing device 25 of the panel-storing shelf, and a rotatable wheel 15 is provided at the end of the auxiliary rod 14 (refer to FIG. 6) to assist the operation of placing panels into the panel-storing shelf or taking out panels from the panel-storing shelf, and works to temporarily hold a panel.

Further, a plurality of auxiliary rods can be provided. In the case of two auxiliary rods, the auxiliary rods 14 are disposed on the fixing device 25 and parallel to the direction in which the panel moves in and out of the panel-storing shelf. These two auxiliary rods 14 can assist the operation of placing panels into the panel-storing shelf or taking out panels from the panel-storing shelf, and work to temporarily hold a panel. Each auxiliary rod 14 can be in an extensible structure, that is, the auxiliary rods 14 can stretch to provide a placing stage when tracks 23 stop moving, and the auxiliary rods 14 contract to a location at which they do not interfere with the tracks 23 which are driven to move panels. A rotatable wheel 15 can be disposed at the end of each auxiliary rod 14. When one panel needs to be placed from exterior, the tracks 23 stop moving, the transporting stage directly transports the panel into the panel-storing shelf and the panel is supported by the two auxiliary rods 14. The panel moves on the rotatable wheels 15 under external force until completely enters into the panel-storing shelf. Next, the tracks 23 start to move from bottom to top; when the brackets on the tracks 23 nearest to the panel supported by the auxiliary rods 14 contacts the panel, the auxiliary rods 14 contract to the location at which they do not interfere with the tracks 23 to drive the panel, and then the track 23 drives the panel to move on. When one panel needs to be taken out from the panel-storing shelf, the tracks 23 stop moving, and after the auxiliary rods 14 stretch to provide a placing stage, the tracks 23 begins to move again from top to bottom. Next, after the panel on the tracks 23 nearest to the auxiliary rods 14 contacts the auxiliary rods 14, the tracks 23 stop moving again, the panel is moved the rotatable wheel 15 under external force until completely leaves the panel-storing shelf.

Figure 7:
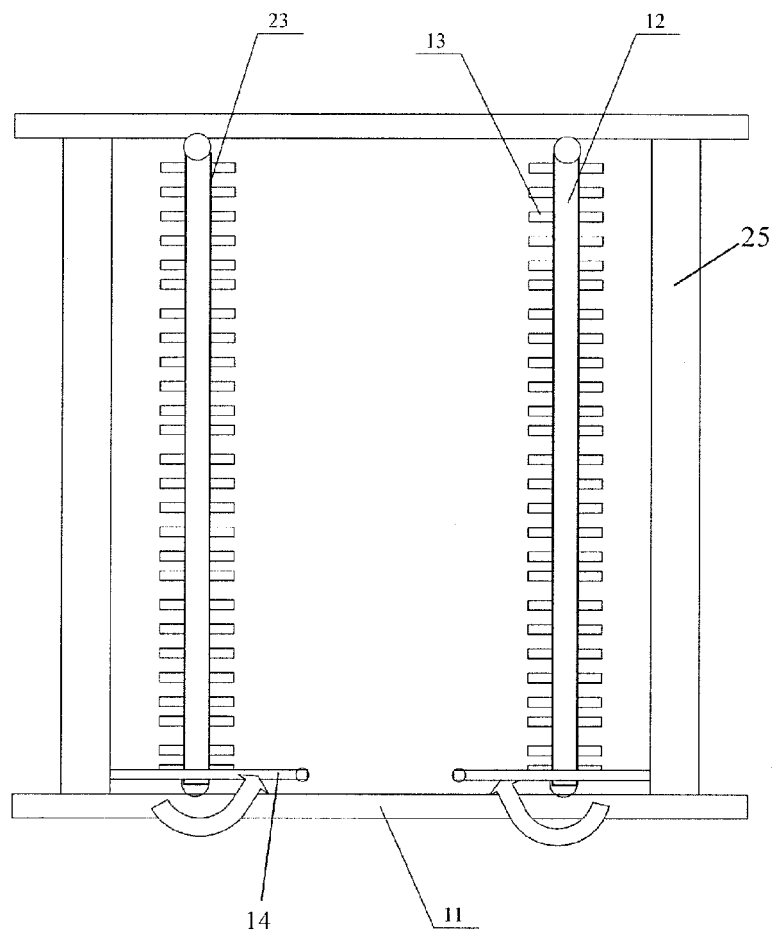
FIG. 7 is another structural view illustrating the panel-storing shelf according to an embodiment of the present invention.

Furthermore, the structure of the panel-storing shelf of this embodiment can also refer to FIG. 7. FIG. 7 is another structural view illustrating the panel-storing shelf according to this embodiment of the present invention. In this example, the brackets 13 are fixedly disposed on the support member 12 and disposed in horizontal direction.

Furthermore, since the panel-storing shelf of the embodiment can be used load panels from exterior, a sensor for detecting loading of the panel can be provided. Also, such a sensor can be provided in the panel-storing shelf of the first embodiment. Particularly, referring to FIG. 5, a first sensor 16 can be provided; the first sensor 16 is disposed at the bottom of the panel-storing shelf, and the location of the first sensor 16 corresponds to the inner end of the panel when it is placed into the panel-storing shelf from exterior. The first sensor 16 can be used to detect whether the panel has completely entered into the panel-storing shelf. In addition, a second sensor 17 can be provided in the panel-storing shelf. The second sensor 17 is disposed at the top of the panel-storing shelf and be used to detect whether the panel-storing shelf has been full of panels. With the above sensors, the loading process of the panels can be accurately controlled.

In FIGS. 5 and 6, the support members 12 provided between the top and bottom walls 111 and 112 of the casing 11 are omitted for simplicity.

In the panel-storing shelf of the embodiment, by providing tracks on the support members and by providing brackets for supporting panels on the tracks, the panels can be moved in the panel-storing shelf in the height direction, which gives more flexibility. In addition, by providing an auxiliary rod, panels can be automatically placed from exterior. Since the panel can flexibly vertically move in the panel-storing shelf, compared with the case where the holding layer has a fixed structure, it is more convenient to cooperate with other automatic transporting equipments to transport panels, thus the efficiency of transporting the panels can be improved.

Third Embodiment

The embodiment of the present invention provides a panel-transporting system, and the system may comprise a panel-storing shelf and a transporting stage. The panel-storing shelf can used to hold a liquid crystal panel, the transporting stage can be used to transport panels, and the panel-storing shelf and the transporting stage cooperate with each other so as to take out a panel from the panel-storing shelf or place a panel into the panel-storing shelf.

Figure 8:
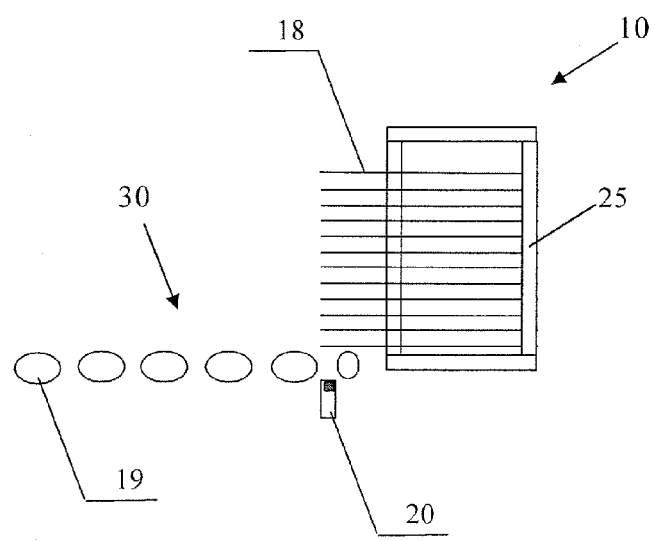
FIG. 8 is a structural view illustrating the panel-transporting system according to the third embodiment of the present invention.

FIG. 8 is a structural view illustrating the panel-transporting system according to the third embodiment of the present invention. As shown in FIG. 8, the transporting stage 30 in the panel-transporting system of the embodiment may be a transporting stage comprising a plurality of rotating rollers. The controller (not shown) for controlling the panel-storing shelf and the transporting stage may be an independent device, but not limited to this. For example, the controller can also be integrated into the panel-storing shelf or the transporting stage. The controller is used to receive sensed signal emitting from a sensor disposed on the transporting stage or the panel-storing shelf, and to output control signal according to the sensed signal to control the movement of the transporting stage or the panel-storing shelf.

Referring to FIG. 8, the panel-storing shelf may adopt any panel-storing shelf of the first or second embodiment. In the present embodiment, the panel-storing shelf 10 of the first embodiment is used, for example. There are several panels 8 stored in the panel-storing shelf 10. The panel-storing shelf 10 of the present embodiment can be disposed adjacent to the transporting stage 30 so that the panel held at the lowest layer of the panel-storing shelf 10 partially overlaps the transporting stage 30, and the transporting stage 30 can directly take out the panel from the panel-storing shelf 10 or place the panel into the panel-storing shelf 10. The controller is used to control the transporting stage to take out the panel from the panel-storing shelf or to place the panel into the panel-storing shelf.

Particularly, the transporting stage may comprise a plurality of rotating rollers 19; among the rotating rollers 19, the panel held at the lowest layer of the panel-storing shelf, which is formed with brackets, at the same level on the tracks overlaps some rotating rollers 19. Considering that the friction force generated when the rotating rollers 19 rotate can successfully pull the panel to move, a frictional wheel may be used for each roller 19. The frictional wheel may use material such as rubber and the like, or may have rubber tape disposed on a rotating wheel. In addition, a third sensor 20 can be disposed at the bottom of the transporting stage, and under the overlapped portion in order to check whether a panel has been placed on the transporting stage when the panel is taken out, so that the transporting stage can perform the subsequent transportation. Alternatively, the third sensor may be used to check whether a panel enters into the panel-storing shelf when the panel is placed into the panel-storing shelf, so the tracks in the panel-storing shelf can next rotate to drive the panel to move up or down. The controller in the present embodiment is used to receive the sensed signal emitting from the third sensor 20, and output control signal according to the sensed signal to control the movement of the transporting stage or the panel-storing shelf. The controller may further comprise a frequency converter which is connected with the panel-storing shelf to adjust the movement speed of the panel-storing shelf.

Figure 9:
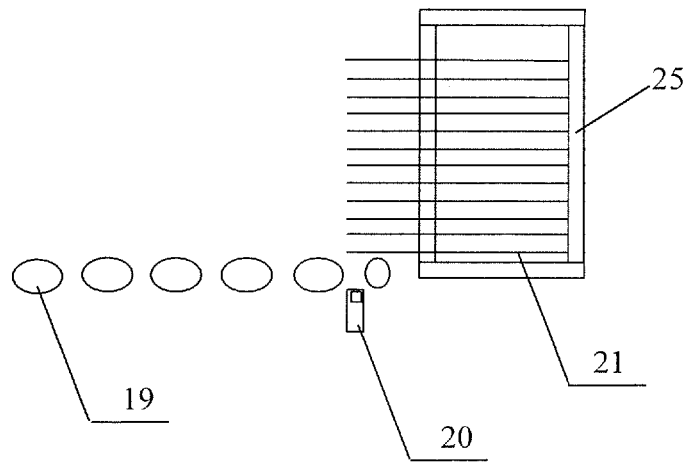
FIG. 9 is the first view illustrating the taking out process of the panel-transporting system according to the third embodiment of the present invention.

The operation of the panel-transporting system according to the present embodiment will be described in details hereafter with reference to FIGS. 9-11. FIG. 9 is the first view illustrating the taking out process of the panel-transporting system according to the third embodiment of the present invention, FIG. 10 is the second view illustrating the taking out process of the panel-transporting system according to the third embodiment of the present invention, FIG. 11 is the third view illustrating the taking out process of the panel-transporting system according to the third embodiment of the present invention, and FIGS. 9-11 illustrate the sequential processes of taking out the panel.

Firstly, the panels vertically move along with the rotation of the tracks in the panel-storing shelf, and the panels move at a constant speed to the bottom of the panel-storing shelf under the control of the frequency converter. As shown in FIG. 9, for example, when an objective panel 21 is taken out, the objective panel 21 first is moved to the lowest layer of the panel-storing shelf, and the objective panel partially overlaps the rotating rollers of the transporting stage. At this time, the third sensor 20 disposed under the overlapped portion can check whether the objective panel 21 has contacted the transporting stage. The third sensor 20 sends the sensed signal to the controller to report that the objective panel 21 has arrived at the transporting stage. The controller then outputs a control signal according to the sensed signal to control the tracks in the panel-storing shelf to stop moving temporarily.

Figure 10:
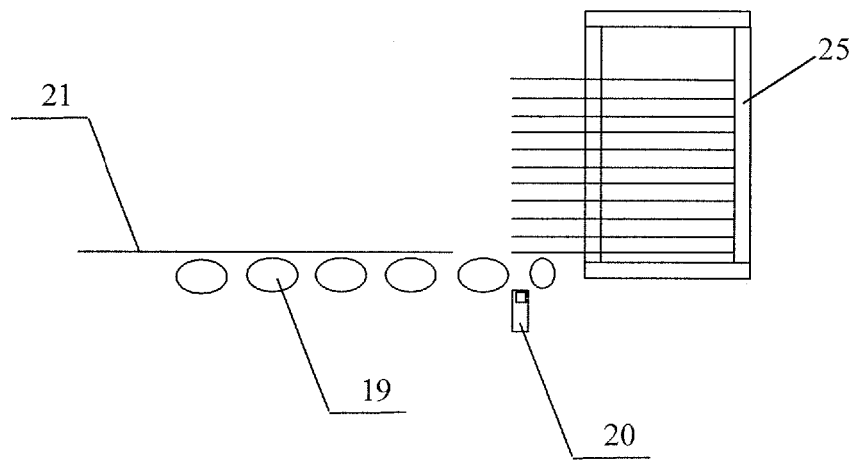
FIG. 10 is the second view illustrating the taking out process of the panel-transporting system according to the third embodiment of the present invention.

Then, referring to FIG. 10, the rotating rollers 19 of the transporting stage can drive the objective panel 21 due to its own friction force during its rotation process, so that the objective panel 21 can be transferred to the transporting stage from the panel-storing shelf. The transporting stage may transport the objective panel 21 to the next step.

Figure 11:
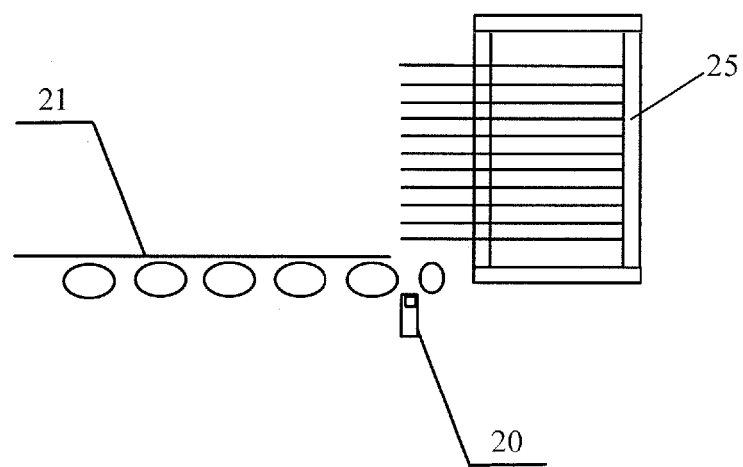
FIG. 11 is the third view illustrating the taking out process of the panel-transporting system according to the third embodiment of the present invention.

Finally, as shown in FIG. 11, when the objective panel 21 completely passes by the third sensor 20, the third sensor 20 outputs the sensed signal again to the controller to report that the objective panel 21 has been completely taken out from the panel-storing shelf. The controller controls the tracks in the panel-storing shelf start to move again according to the sensed signal and transport the next panel to the lowest layer of the panel-storing shelf, so that the next panel taking-out process can begin. In addition, the first sensor disposed at the bottom of the panel-storing shelf can sense whether there is no panel in the panel-storing shelf when panels in the panel-storing shelf have been completely taken out, output the sensed signal to the controller, so that the controller can output control signal to control the track in the panel-storing shelf to stop moving, thus the panel taking out process is completed.

The panel-transporting system according to the present embodiment replaces the transporting operation of a robot with a transporting stage and a panel-storing shelf, and completes the transporting process of one panel in cooperation with the movement within the panel-storing shelf, thus operation time is remarkably reduced and productivity is improved. Also, since a robot is not necessary any more, the complicate movement of the robot can be avoided, and the cost for repairing and maintaining the robot can be entirely saved.

In FIGS. 8-11, the support members 12 provided between the top and bottom walls 111 and 112 of the casing 11 are omitted for simplicity.

Fourth Embodiment

Figure 12:
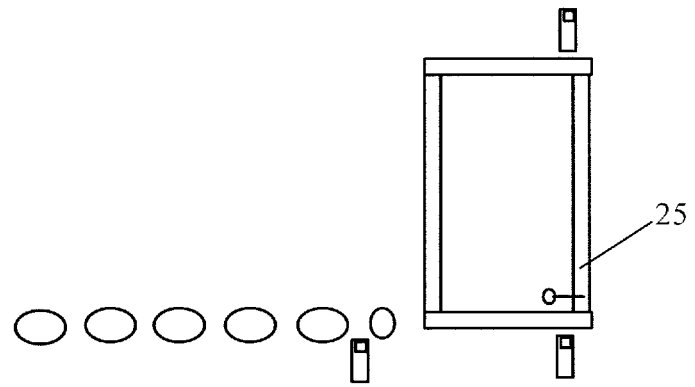
FIG. 12 is a structural view illustrating the panel-transporting system according to the fourth embodiment of the present invention.

FIG. 12 is a structural view illustrating the panel-transporting system according to the fourth embodiment of the present invention. As shown in FIG. 12, the panel-transporting system according to the present embodiment also comprises a panel-storing shelf, a transporting stage and a controller. The panel-storing shelf in the present embodiment adopts the structure of the second embodiment, and the transporting stage may adopt the structure of the third embodiment. The specific structure can be obtained by referring to the description in the second embodiment and the third embodiment and will not be repeated here for simplicity.

Figure 13:
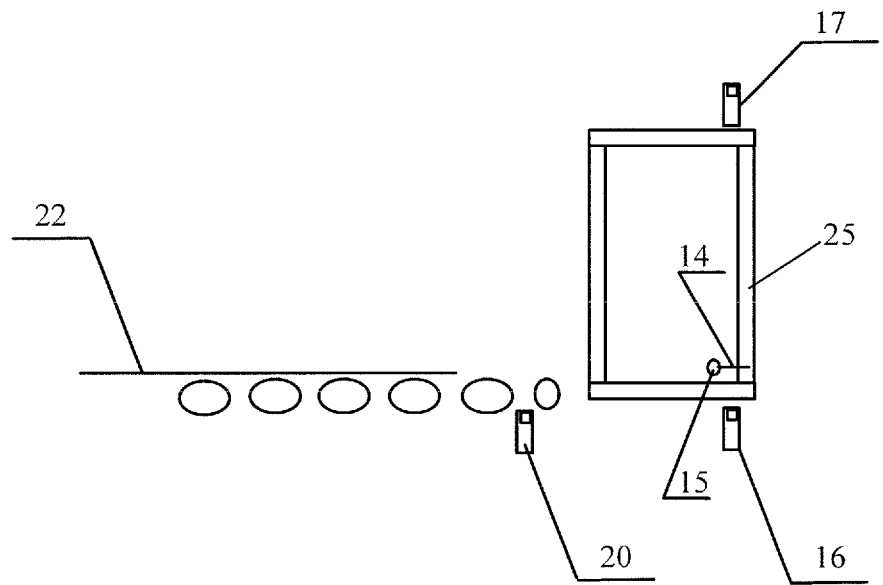
FIG. 13 is the first view illustrating the placing process of the panel-transporting system according to the fourth embodiment of the present invention.

The operation process of the panel-transporting system according to the present embodiment will be described in details with reference to FIGS. 12-15. FIG. 13 is the first view illustrating the placing process of the panel-transporting system according to the fourth embodiment of the present invention, FIG. 14 is the second view illustrating the placing process of the panel-transporting system according to the fourth embodiment of the present invention, FIG. 15 is the third view illustrating the placing process of the panel-transporting system according to the fourth embodiment of the present invention, and FIGS. 13-15 illustrate the sequential processes of placing the panel.

Firstly, as shown in FIG. 13, when one panel 22 to be loaded is transported outside the panel-storing shelf by the transporting stage, it is sensed by the third sensor 20 while passing by the third sensor 20. The third sensor 20 outputs the sensed signal to the controller to report that the panel 20 to be loaded has arrived at the loading entrance of the panel-storing shelf, i.e., the panel 22 to be loaded is going to enter into the panel-storing shelf. At this time, the controller outputs control signal according to the sensed signal to control the auxiliary rods 14 in the panel-storing shelf to rotate to a given angle. The auxiliary rods 14 are disposed on a fixing device parallel to the direction in which the panel moves in and out of the panel-storing shelf. The auxiliary rods 14 assist the operation of placing the panel into the panel-storing shelf, and work to temporarily hold a panel. The auxiliary rods 14 each can be in an extensible structure. When the panel 22 is about to be loaded into the panel-storing shelf, the tracks of the panel-storing shelf stop moving, and the auxiliary rods 14 stretch out to form a placing stage. A rotatable wheel 15 is disposed at the end of each auxiliary rod 14. In order to make the friction force generated when the rotatable wheels rotate able to successfully drive the panel to move, the rotatable wheels 15 disposed on the auxiliary rods 14 can adopt material such as rubber and the like or have the rubber tape disposed on one rotating wheel. The transporting stage directly transports the panel into the panel-storing shelf so that the panel is supported by two auxiliary rods 14. The panel moves on the rotatable wheels 15 under external force until completely enters into the panel-storing shelf.

Figure 14:
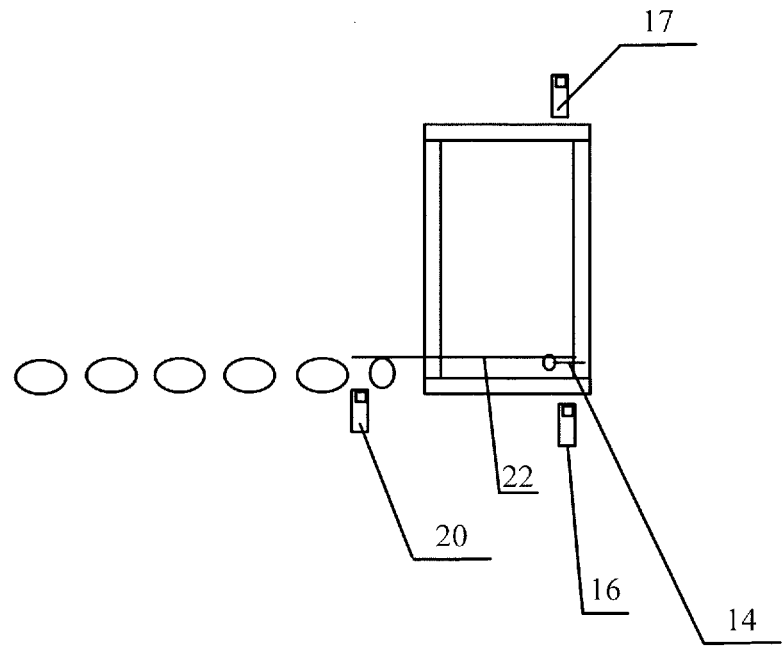
FIG. 14 is the second view illustrating the placing process of the panel-transporting system according to the fourth embodiment of the present invention.

Then, as shown in FIG. 14, when the panel 22 to be loaded completely enters into the panel-storing shelf, the first sensor 16 disposed at one end of the bottom of the panel-storing shelf can sense the panel 22 to be loaded. At this time, the first sensor 16 outputs the sensed signal to the controller, and next the controller outputs control signal according to the sensed signal to control the tracks in the panel-storing shelf to move from bottom to top. When the brackets on the tracks 23 nearest to the panel supported by the auxiliary rods 14 contacts the panel, the auxiliary rods 14 contract to a location at which they do not interfere with the tracks 23 to drive the panel, and thus the tracks drives the panel to move up or down.

Figure 15:
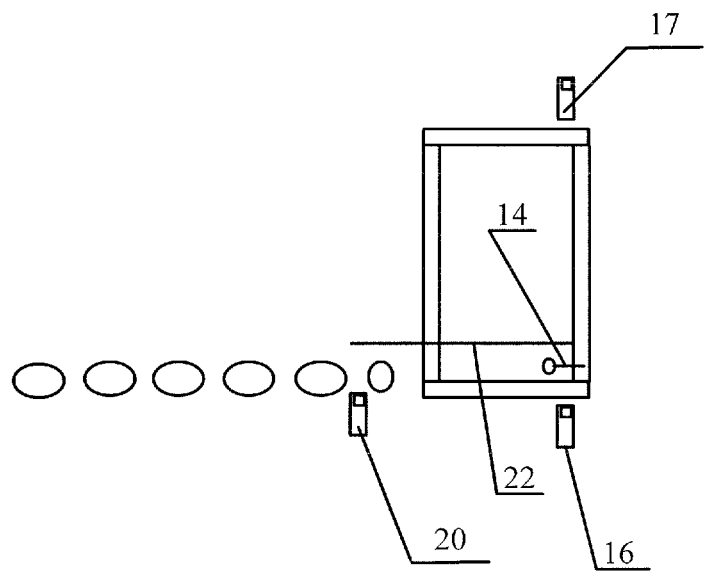
FIG. 15 is the third view illustrating the placing process of the panel-transporting system according to the fourth embodiment of the present invention.

Finally, as shown in FIG. 15, the track of the panel-storing shelf begins to move vertically at a constant speed, and the brackets on the tracks move vertically together with the panel 22 to be loaded. At this time, the controller can control the transporting stage to stop moving so as to avoid the collision during the loading process of the panel. When the first sensor 16 senses that the panel has left, it means that the panel has been loaded, and the first sensor 16 outputs the sensed signal to the controller. The controller outputs control signal according to the sensed signal to control the tracks in the panel-storing shelf to stop their vertical movement temporarily so as to complete the loading process of one panel. Meantime, the controller may control the transporting stage begins to operate again, and the loading process of the next panel begins. In addition, when the panel-storing shelf is full of panels, the second sensor 17 disposed at the top of the panel-storing shelf can sense this situation and inform the controller, thus the controller instructs both the tracks of the panel-storing shelf and the transporting stage to stop moving, and the loading process of the panel is completed.

In addition, the panel-transporting system of the present embodiment can also be used to take out one panel from the panel-storing shelf. During the taking out process, the auxiliary rods 14 also assist to take out the panel from the panel-storing shelf and work to temporarily hold a panel. When one panel needs to be taken out, the tracks stop moving; after the auxiliary rods 14 stretch out to form a placing stage, the tracks begin to move from top to bottom. After the panel on the tracks 23 nearest to the auxiliary rods 14 contacts the auxiliary rods 14, the track stop moving again, the panel moves on the rotatable wheel 15 under external force until completely leaves the panel-storing shelf.

In FIGS. 12-14, the support members 12 provided between the top and bottom walls 111 and 112 of the casing 11 are omitted for simplicity.

The panel-transporting system according to the present embodiment replaces the transporting operation of a robot with transporting stage, and completes the transporting process of the panel cooperate with movement within the panel-storing shelf, and thus the operation time is remarkably reduced and the productivity is improved. Also, since a robot is not necessary any more, the complicate movement of the robot has been saved, and the cost of repairing and maintaining the robot has been entirely saved.

It should be understood that the above embodiments are used only for illustration the technical solutions of the present invention and not for the purpose of limitation. Although the present invention has been described in detail referring to the above embodiments, those ordinarily skilled in the art should understand that it is possible to make modifications to solutions recorded in the above embodiments, or equivalent alterations may be made to some of the technical features in the embodiments. All these modifications or alterations do not depart from the spirit and scope of the present invention.

What is claimed is:

1. A panel-storing shelf comprising:
    at least two support members;
    at least two tracks respectively disposed around a surface of one of the at least two support members and capable of rotating about the respective support member;
    at least two brackets respectively disposed on one of the at least two tracks and at the same level to hold a panel, and capable of rotating along with the respective track;
    at least two holding members respectively provided on the at least two tracks and extending outwards from the at least two tracks, wherein the at least two brackets are respectively pivotably fixed to the at least two tracks, and the at least two brackets are configured to be respectively supported by the at least two holding members at outer ends of the at least two holding members in an operation state and hang down naturally and separate from the at least two holding members in a non-operation state;
    a fixing device; and
    an auxiliary member disposed on the fixing device in the panel-storing shelf to place a panel loaded from exterior onto the brackets or take out the panel placed on the brackets, wherein an end of the auxiliary member is disposed with a rotatable wheel configured for moving the panel thereon under external force.

2. The panel-storing shelf according to claim 1, further comprising:
    a first sensor disposed at the bottom of the panel-storing shelf to detect whether a panel has completely entered into the panel-storing shelf.

3. The panel-storing shelf according to claim 2, further comprising:
    a second sensor disposed at the top of the panel-storing shelf to detect whether the panel-storing shelf has been full of panels.

4. The panel-storing shelf according to claim 1, further comprising:
    a second sensor disposed at the top of the panel-storing shelf to detect whether the panel-storing shelf has been full of panels.

5. The panel-storing shelf according to claim 1, wherein the brackets are rotatably installed on the tracks.

6. A panel-transporting system comprising:
    a transporting stage; and
    the panel-storing shelf according to claim 1, wherein the transporting stage is provided used to transport a panel out or into in the panel-storing shelf.

7. The panel-transporting system according to claim 6, wherein the transporting stage comprises a plurality of rotating rollers, and the rotating rollers each comprise a frictional rotating wheel.

8. The panel-transporting system according to claim 6, wherein the transporting stage is disposed with a third sensor to sense whether the panel has been placed on the transporting stage when the panel is taken out from the panel-storing shelf, or whether the panel has entered into the panel-storing shelf when the panel is loaded into the panel-storing shelf.

9. The panel-transporting system according to claim 6, further comprising:
    a controller connected with the transporting stage and the panel-storing shelf, respectively, to receive sensed signal emitted by the transporting stage or the panel-storing shelf and to output control signal according to the sensed signal to control the transporting stage or the panel-storing shelf.

10. The method panel-transporting system according to claim 9, wherein the controller comprises a frequency converter connected with the panel-storing shelf to adjust the movement speed of the panel-storing shelf.

\* \* \* \* \*